(12) United States Patent
Patin et al.

(10) Patent No.: US 9,453,884 B2
(45) Date of Patent: Sep. 27, 2016

(54) METHOD FOR DETERMINING A STATE VARIABLE OF AN ELECTROCHEMICAL CELL USING COMPLEX IMPEDANCE AT RADIOELECTRIC FREQUENCIES

(71) Applicant: SAFT, Bagnolet (FR)

(72) Inventors: Alain Patin, Le Taillan Médoc (FR); Patrice Fleureau, Le Taillan Médoc (FR); Philippe Desprez, Le Taillan Médoc (FR); Loïc Reboussin, Eysines (FR)

(73) Assignee: SAFT, Bagnolet (FR)

( * ) Notice: Subject to any disclaimer, the term of this patent is extended or adjusted under 35 U.S.C. 154(b) by 628 days.

(21) Appl. No.: 13/724,783

(22) Filed: Dec. 21, 2012

(65) Prior Publication Data

US 2013/0162258 A1 Jun. 27, 2013

(30) Foreign Application Priority Data

Dec. 23, 2011 (FR) ...................................... 11 62421

(51) Int. Cl.
*G01N 27/416* (2006.01)
*G01R 31/36* (2006.01)
*G01R 23/16* (2006.01)
(Continued)

(52) U.S. Cl.
CPC ........... *G01R 31/3606* (2013.01); *G01R 27/02* (2013.01); *G01R 27/28* (2013.01); *G01R 31/001* (2013.01); *G01R 31/3662* (2013.01); *G01R 31/3679* (2013.01); *H01M 10/42* (2013.01)

(58) Field of Classification Search
CPC .......... G01R 31/3606; G01R 31/3651; B60L 3/0046; B60L 11/1861; H01M 6/5044; H01M 10/48
USPC ........... 324/427, 426, 430; 320/132; 702/63, 702/65, 75, 76, 82
See application file for complete search history.

(56) References Cited

U.S. PATENT DOCUMENTS

| | | | |
|---|---|---|---|
| 6,424,864 B1 * | 7/2002 | Matsuura ........... | A61H 23/0245 607/3 |
| 7,098,670 B2 * | 8/2006 | Cole ..................... | G01R 27/28 324/601 |
| 7,741,933 B2 * | 6/2010 | Duwel ................. | H03H 9/0095 333/186 |

(Continued)

FOREIGN PATENT DOCUMENTS

| | | |
|---|---|---|
| DE | 1020090009954 A1 | 8/2010 |
| DE | 10 2009 018 079 A1 | 10/2010 |

(Continued)

OTHER PUBLICATIONS

European Search Report; Application No. 12 19 8663; Apr. 18, 2013.

(Continued)

*Primary Examiner* — M'Baye Diao
(74) *Attorney, Agent, or Firm* — Sughrue Mion, PLLC (57) ABSTRACT

A method is provided for determining a state variable such as aging of an electrochemical cell comprising an electrode plate group, that includes analyzing at least a portion of a response spectrum of the electrochemical cell to application of an electromagnetic wave in a frequency ranging from 10 kHz to 10 GHz, so as to determine an indicator of the value of the state variable.

20 Claims, 9 Drawing Sheets

(51) Int. Cl.
*G01N 37/00* (2006.01)
*G01R 27/02* (2006.01)
*G01R 27/28* (2006.01)
*G01R 31/00* (2006.01)
*H01M 10/42* (2006.01)

(56) References Cited

U.S. PATENT DOCUMENTS

| | | |
|---|---|---|
| 8,175,827 B2 * | 5/2012 | Walker et al. .................. 702/65 |
| 8,446,127 B2 * | 5/2013 | Yazami et al. ................ 320/132 |
| 2006/0284617 A1 | 12/2006 | Kozlowski et al. |
| 2008/0150541 A1 * | 6/2008 | Salman et al. ................ 324/430 |
| 2008/0262796 A1 * | 10/2008 | Rufer et al. .................. 702/184 |
| 2009/0166542 A1 * | 7/2009 | Ruan ....................... G01T 1/362 |
| | | 250/369 |
| 2010/0297291 A1 * | 11/2010 | Shinoda ............... G01N 21/359 |
| | | 426/15 |
| 2011/0074432 A1 | 3/2011 | Tinnemeyer |
| 2011/0166812 A1 * | 7/2011 | Potyrailo et al. ............... 702/65 |
| 2012/0148880 A1 | 6/2012 | Schaefer et al. |
| 2014/0091811 A1 * | 4/2014 | Potyrailo ........... G06K 19/0717 |
| | | 324/602 |

FOREIGN PATENT DOCUMENTS

| | | |
|---|---|---|
| EP | 0 388099 A2 | 9/1990 |
| FR | 2 737 923 A1 | 2/1997 |
| WO | 2012/168066 A1 | 12/2012 |

OTHER PUBLICATIONS

French Search Report of FR 11 62 421 dated Aug. 29, 2012.

* cited by examiner

Fig.3a reflection without load (open circuit)

METHOD FOR DETERMINING A STATE VARIABLE OF AN ELECTROCHEMICAL CELL USING COMPLEX IMPEDANCE AT RADIOELECTRIC FREQUENCIES

This is a U.S. Non-Provisional Application of French Application No. 11 62 421 filed Dec. 23, 2011, the contents of all of which are incorporated herein by reference in their entirety.

TECHNICAL FIELD

The invention relates to the technical field of non-destructive characterization of physico-chemical parameters of an electrochemical cell.

STATE OF THE ART

An electrochemical cell, also referred to in what follows simply by the term "cell" is a device for generating electricity in which chemical energy is converted into electrical energy. The chemical energy is in the form of electrochemically active compounds deposited on at least one side of metal strips. The electrical energy is generated by electrochemical reactions during discharge of the cell. Electrodes, disposed in a container, are electrically connected to output terminals of the current which provide electrical continuity between the electrodes and an electrical load to which the cell is associated. The positive and negative electrodes are separated by a separator which prevents the contact of an electrode of a given polarity with an electrode of opposite polarity. The separator and the electrodes are impregnated with an electrolyte. The electrolyte allows the migration of ions between the electrodes.

There are various causes of aging of an electrochemical cell. Aging may be due to corrosion of the electrodes, to a loss of adhesion of the electrochemically active compounds to the current collector metal foil, to a decrease in the amount of electrolyte, to drying of the separator, etc.

Aging can be detected by measuring the internal resistance of the cell. Indeed, the latter increases gradually over the life of the cell. For a given cell type, a threshold value of internal resistance can be set beyond which it is considered that the cell has reached the end of its life. The internal resistance R of a cell can be measured for example by causing discharge of the cell at a current I and measuring the voltage drop $\Delta U$ across its terminals. The internal resistance is obtained by applying the relation $R=\Delta U/I$. This non-destructive technique does make it possible to measure the total resistance of the cell but does not make it possible to determine whether the increase in resistance is due to a deterioration of the electrodes or deterioration of the electrolyte.

It is also known to use impedance spectroscopy to monitor the increase in internal resistance of an electrochemical cell during aging. This technique involves measuring the electrical response of a cell when it is subjected to a sinusoidal current or to a sinusoidal variation in voltage. The complex impedance measured by this technique is given by $Z=$modulus $(Z)$ exp $(i*$argument $(Z))$. This technique makes it possible to follow changes in cell impedance, providing information on its aging.

Other techniques not based on electrical signals are also known for determining the state of a cell, either its aging or its state of charge. Among these methods, we can mention the method of analyzing acoustic pressure waves originating from operation of the electrochemical cell, for example due to the appearance of gas. We can also mention a technique that makes use of magnetic susceptibility variations of the electrolyte and the electrodes according to the state of charge of the electrochemical cell. This technique makes it possible to determine the state of charge of a cell from its magnetic susceptibility. The magnetic field decreases when the cell is being discharged and increases when the cell is being charged. This method enables precise detection of the state of charge in a range of 40 to 70%. More details can be found at this website:

http://batteryuniversity.com/learn/article/how_to_know_end_of_battery_life.

All the methods mentioned above give more or less precise information on the state of charge of an electrochemical cell, its aging, but do not give specific information on the cause and origin of aging.

Current methods of determining the origin of a failure of an electrochemical cell require disassembly of the cell in order to perform a visual inspection of the various components of the cell. This technique is, firstly, destructive of the cell and, secondly, does not make it possible to rapidly determine the cause of failure.

There is therefore a need for a method for detecting the presence of a fault in an electrochemical cell coming from a manufacturing line. One also looks for a nondestructive method for providing the characteristics of physico-chemical parameters of an electrochemical cell in real-time.

SUMMARY OF THE INVENTION

To this end, the invention provides a method for determining a state variable of an electrochemical cell comprising an electrode plate group, said method comprising analyzing at least a portion of a response spectrum of the electrochemical cell to application of an electromagnetic wave in a frequency ranging from 10 kHz to 10 GHz, so as to determine an indicator of the value of said state variable.

Figure 1:
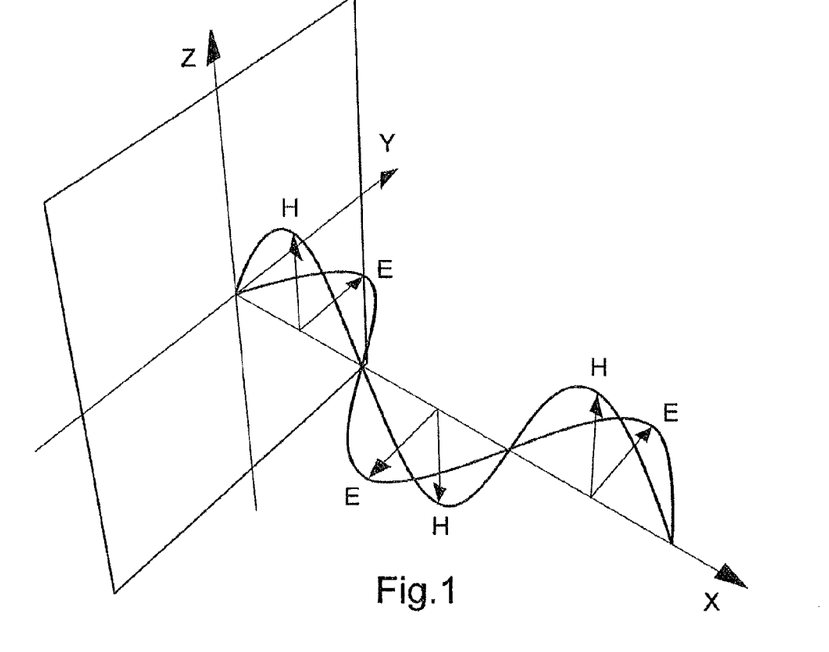
FIG. 1 shows schematically the components of the electric field E and magnetic field H of an electromagnetic wave.

An electromagnetic wave is a new means for inspecting an electrochemical cell, using different principles of physics to the methods mentioned above. It will be remembered that an electromagnetic wave consists of two components: an electric field E and a magnetic field H. The two fields are perpendicular to each other, their amplitudes are in a constant ratio and their variations are in phase. FIG. 1 shows the relative directions of the lines of the electric field E, the magnetic field H and the direction of propagation, as represented by the X axis, of an electromagnetic wave. If one of the field lines change direction, the direction of propagation is reversed. The electric field E and magnetic field H are considered as varying sinusoidally with time. We talk of impedance for the processing of a signal from the propagation of the electromagnetic wave. This complex impedance is of a different nature to that of an electrochemical impedance which is defined on an electrical signal, while in the present invention it is in relation with the propagation of an electromagnetic wave.

By the term state variable we mean a physical, physico-chemical or chemical characteristic of a constituent of the electrochemical cell. A physical characteristic can be related to the geometry of the cell and to component parts, such as the height or length of the electrode plate group in the unwound state or electrolyte volume. A physicochemical characteristic may be the nature of the active materials, their composition, crystallographic structure, their particle size or the nature of the active material consisting of the active matter, percolation additives and binders. A chemical characteristic may be the concentration of dissolved salts in the electrolyte, the degree of impregnation (or soaking up) of electrolyte by the electrodes or the separator. These state variables consequently include the state of the cell: its capacity, internal resistance, its state of charge, state of health, defects.

By the expression "indicator of the value of a state variable" we mean a physical value originating from analysis of the impedance spectrum enabling a value of the state variable to be deduced therefrom. This may be the resonance frequency, the real part, the imaginary part or the argument of the complex impedance.

The method according to the invention makes it possible to determine certain physical or chemical characteristics of an electrochemical cell from the analysis of complex impedance when the cell is subjected to an electromagnetic wave. The method according to the invention comprises applying to the electrochemical cell a signal the frequency of which is related to the physical dimensions of the cell. It makes it possible to determine in real time and non-destructively the state of an electrochemical cell (aging, state of charge) as well as the cause of a fault in an electrochemical cell, for example at the end of its manufacturing process.

According to one embodiment, the frequency of the electromagnetic wave is from 100 kHz to 10 GHz, preferably between 1 MHz to 1 GHz, more preferably between 10 MHz to 1 GHz.

According to one embodiment, the value of the state variable is compared to a reference value and the electrochemical cell is considered as faulty if the difference between the value of the state variable and the reference value exceeds a predetermined threshold.

According to one embodiment, the value of the state variable is obtained by comparing the plot of variation in the indicator value of the state variable with the plot of the change of this obtained from the measurement of complex impedance of a reference cell.

According to one embodiment, the state variable is a parameter which varies during the use of the electrochemical cell, such as its capacity, internal resistance, its state of charge, the state of aging of the electrodes, the state of aging of the electrolyte or the state of aging of the separator.

According to one embodiment, the method comprises the steps of:
measuring complex impedance of the electrode plate group;
plotting a complex impedance spectrum of the electrode plate group, and
determining at least one resonance frequency $f_0$ of the complex impedance spectrum which is a frequency at which the imaginary part of the complex impedance is zero.

According to one embodiment, the complex impedance spectrum of the electrode plate group is plotted for a range of frequencies between 200 MHz and 1 GHz, preferably between 300 MHz and 600 MHz and wherein within this range at least one resonance frequency $f_0$ exists, in order to determine the state variable corresponding to the height of the electrode plate group.

According to one embodiment, the complex impedance spectrum of the electrode plate group is plotted for a range of frequencies between 10 MHz and 200 MHz, preferably between 50 MHz to 200 MHz and wherein within the said range at least one resonance frequency $f_0$ exists, in order to determine the state variable corresponding to the length of the unwound electrode plate group.

According to one embodiment, the method comprises the steps of:
measuring complex impedance of the electrode plate group;
plotting variation for a frequency ranging from 0.01 MHz to 10 MHz, preferably between 0.1 MHz to 1 MHz, of at least one indicator selected from the real part of the complex impedance, the imaginary part of the complex impedance or a combination of these, such as the argument of the complex impedance, so as to determine a state variable, preferably aging of the electrochemical cell.

According to one embodiment, the method includes comparing a plot of variation in at least one of said indicators to a plot of variation in the same indicator or indicators obtained from measurement of complex impedance of a reference electrode plate group.

According to one embodiment, the method includes representing variation in the real part of the complex impedance as a function of frequency and at least one peak exists such that a ratio:
(Remax-Max (Re1, Re2))/Remax is greater than 0.5, preferably greater than 0.75
where
Remax denotes the real part at the peak;
Re1 and Re2 denote the real parts of both bases at the peak, and
Max (Re1, Re2) denotes the maximum value of Re1 and Re2.

According to one embodiment, the method includes representing variation in the imaginary part of the complex impedance as a function of frequency and at least one peak exists such that a ratio:
(Immax-Max (Im1, Im2))/Immax is greater than 0.5, preferably greater than 0.75
where
Immax denotes the imaginary part at the peak;
Im1 and Im2 denote the imaginary parts at the two bases at the peak, and
Max (Im1, Im2) represent a maximum value of Im1 and Im2

According to one embodiment, the electrochemical cell is a lithium cell, preferably a cell of the lithium-ion type.

The invention also provides a method of monitoring the manufacture of electrochemical cells, implementing the above method for determining a state variable in which:
the value of the state variable is measured on each cell manufactured;
a cell is rejected if the difference between the value of the state variable measured and a reference value exceeds a predetermined threshold.

According to one embodiment, the monitoring method includes statistical sampling of electrochemical cells on a production line in order to monitor changes in the cells produced.

The invention also provides a computer program product comprising at least one sequence of instructions stored and accessible to a processor, wherein operation of the processor leads to the implementation of the method for determining a state variable.

The invention also provides a computer-readable data carrier suitable for implementing at least one of the sequences of instructions of the computer program product.

BRIEF DESCRIPTION OF THE DRAWINGS

In FIG. 5a, the current collectors (C+, C−) are located at two opposite edges of the electrodes. In FIG. 5b, the current collectors (C+, C−) are located on the same edges of the electrodes.

DETAILED DESCRIPTION OF PREFFERED EMBODIMENTS

Figure 2:
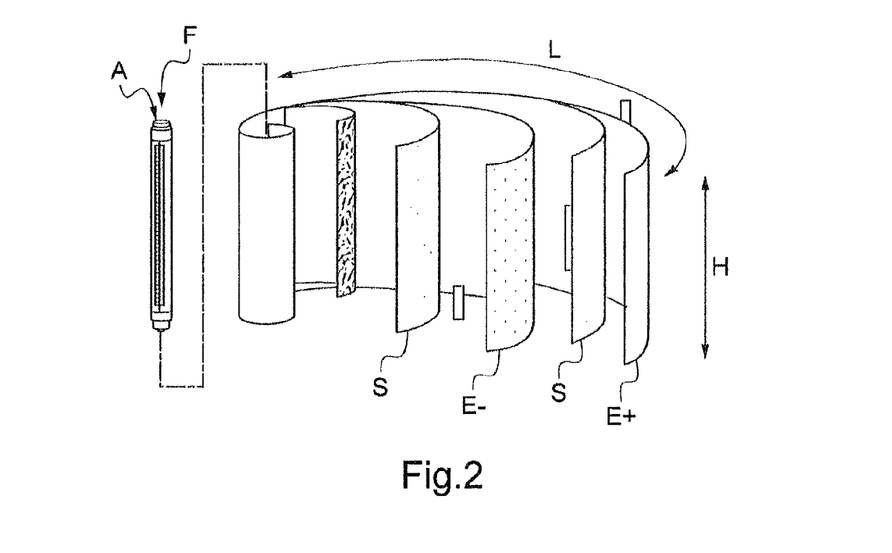
FIG. 2 shows an exploded diagram showing the various components of an electrode plate group.

According to the invention, the electrode plate group of an electrochemical cell is equated to a transmission line through which an electromagnetic wave may propagate. FIG. 2 is an exploded view of an electrode plate group. The electrode plate group (F) is generally constituted of an assembly of positive electrodes (E+) and negative electrodes (E−), a separator being interleaved between a positive electrode and a negative electrode. The positive and negative electrodes are obtained in advance by depositing on at least one side of a metal strip a composition containing an electrochemically-active material. At least one positive electrode, a separator and at least one negative electrode form a stack. This stack is wound around a cylindrical axis (A) which gives the stack a spiral shape thereby forming the electrode assembly. The spirally-wound electrode assembly is introduced into a container of cylindrical shape, which is not shown. The dimensions (height H, length L and thickness) of the strip for the positive electrode and those of the strip for the negative electrode are generally substantially identical. The height H of a strip is defined as the smallest dimension of the strip in the plane formed by the strip when it is an unwound state. The length L of the strip is defined as the greatest dimension of the strip in the plane formed by the strip when it is in an unwound state. The height of the electrode plate group is equal to the height of the strip used for the positive and the negative electrode. The strips used for the electrodes typically have a height H of from about 3 to 30 cm and a length L of up to several meters. In the case of a lithium ion cell, the positive electrode comprises a strip generally of aluminum on which an electrochemically active compound which may be a lithium-containing oxide of a transition metal or a lithium phosphate is deposited. The negative electrode comprises a strip generally of copper on which an electrochemically active compound which may be a vanadium oxide or a carbon compound, such as graphite is deposited. The separator is an electrical insulator which is generally constituted of a polymer such as a polyolefin.

Each electrode is a plate through which an electromagnetic wave propagates. We equate the separator impregnated with electrolyte to a dielectric sandwiched between the positive plate and the negative plate. Like in the case of an antenna through which an electromagnetic wave is passing, the electrode plate group is assimilated to an open parallel-plate transmission line of length L. Due to the tight winding formed by the electrodes and the separator, it is considered that the positive and negative electrodes are combined into a single plate. The electrode plate group, once formed, constitutes a single transmission line for an electromagnetic wave, the line having a length L and being open at its end.

To a first order of magnitude, the complex impedance Z of this line satisfies the general simplified equations for open propagation lines, at radio frequencies, namely:

$$Z = \text{Re}(Z) + j\text{Im}(Z) = (R + r(f)) + j(Z_c \times \coth(\gamma \times L))$$

where:

R is the internal resistance of the cell at the origin of the Joule heating effect, $r(f)$ is the high-frequency resistance due to the connections, known as the skin effect resistance, $Z_c$ is the characteristic impedance of the line, γ is the propagation constant of the line and is $2\pi/\lambda$ λ denotes the wavelength of the electromagnetic signal $\lambda = c/F$ c is the speed of propagation of an electromagnetic wave in vacuum and is $3 \times 10^8$ ms$^{-1}$ $\coth(\gamma \times L)$ denotes the hyperbolic cotangent of the product $\gamma \times L$ L is the length of the line through which the electromagnetic wave propagates j is the imaginary operator.

State variables able to be determined by the invention are those which have an influence on the impedance of the electrode plate group. These can be:
- a dimension of one of the components of the electrode plate group: one can for choose dimensions of the metal strips, such as length or height;
- indicative of a state of aging of an electrode: we can mention the following in the case of a lithium battery: the formation of a deposit of metal lithium on the surface of the negative electrode causing aging of the electrode. Mention may also be made of poor electrolyte percolation.
- indicative of the amount of positive and negative active material deposited respectively on the surface of the positive and negative current collector strips: the method according to the invention allows for example to detect aging of an electrode due to a loss of adhesion of active material on the surface of the current collector. It makes it possible to detect sources of non-uniformity of the coating process of a strip by the active matter.
- indicative of a change in the separator: the degree of diffusion of the electrolyte into the pores of the separator, in other words the degree of impregnation of the separator by the electrolyte influences the impedance of the electrochemical cell. The method according to the invention allows for example to detect a drying out of the separator as a result of electrolyte consumption during operation of the electrochemical cell. Drying of the separator causes a rise in the internal resistance of the electrochemical cell. The method can also detect the presence of micro short-circuits resulting from microscopic tearing in the separator.
- indicative of the amount of electrolyte and the concentration of salts in the electrolyte.

By using the complex impedance spectrum it becomes possible to initially determine an indicator of the value of a state variable. In a second step, we deduce the value of the state variable from the indicator. As explained above, the indicator of the value of the state variable can be resonance frequency, the real part, imaginary part or the argument of the complex impedance.

Using the real part "$Re(Z)=R+r(f)$" allows for example to determine the physico-chemical characteristics of the electrodes and their aging condition.

Making use of the imaginary part "$Im(Z)=Z_c \times \coth(\gamma \times L)$" allows for example to determine the state of aging or deterioration of the electrolyte and its interfacing with the electrodes, as well as micro short-circuits. The characteristics of the separator impregnated with electrolyte can also be determined by analysis of the imaginary part.

Deterioration of the electrodes is manifested by an increase in sheet resistance $r(f)$, this resistance being measured at frequencies for which a quarter wavelength corresponds to the height of the electrode plate group (frequencies corresponding to cancellation of the imaginary part). Once the frequency has been initially determined, it is kept constant so as not to incorporate change in resistance as a function of frequency.

Figure 3A:
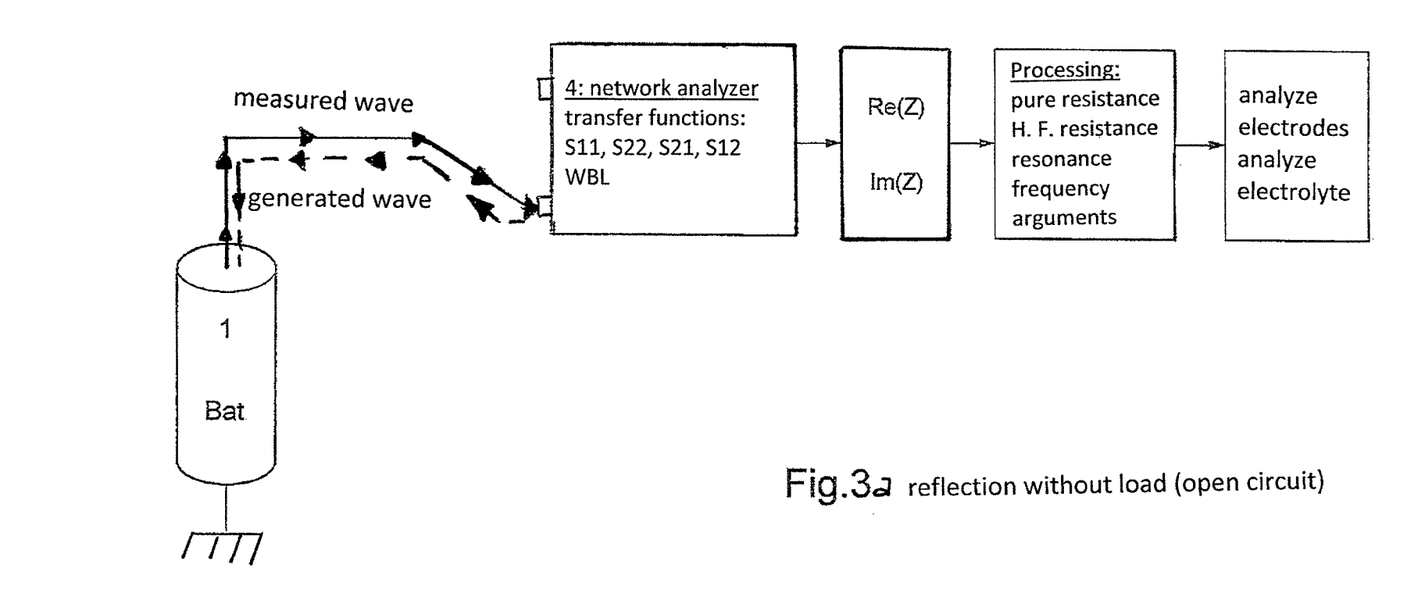
FIG. 3a is a schematic diagram of the acquisition of impedance measurements in the case where an electromagnetic wave is reflected by the electrode plate group, the electrochemical cell being neither charged nor discharged (open circuit).
Figure 3B:
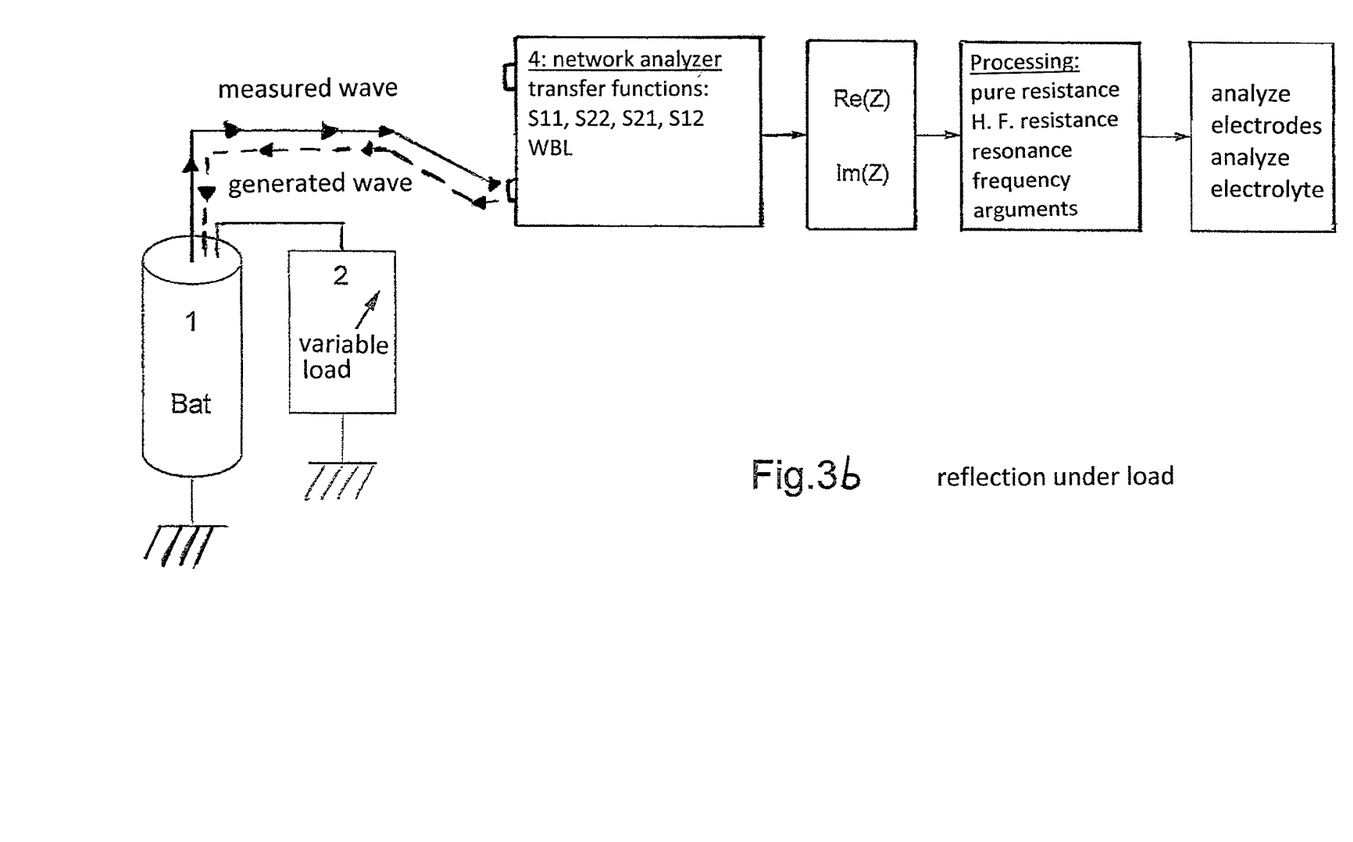
FIG. 3b is a schematic diagram of the acquisition of impedance measurements in the case where an electromagnetic wave is reflected by the electrode plate group, the electrochemical cell being either charged or discharged.
Figure 3C:
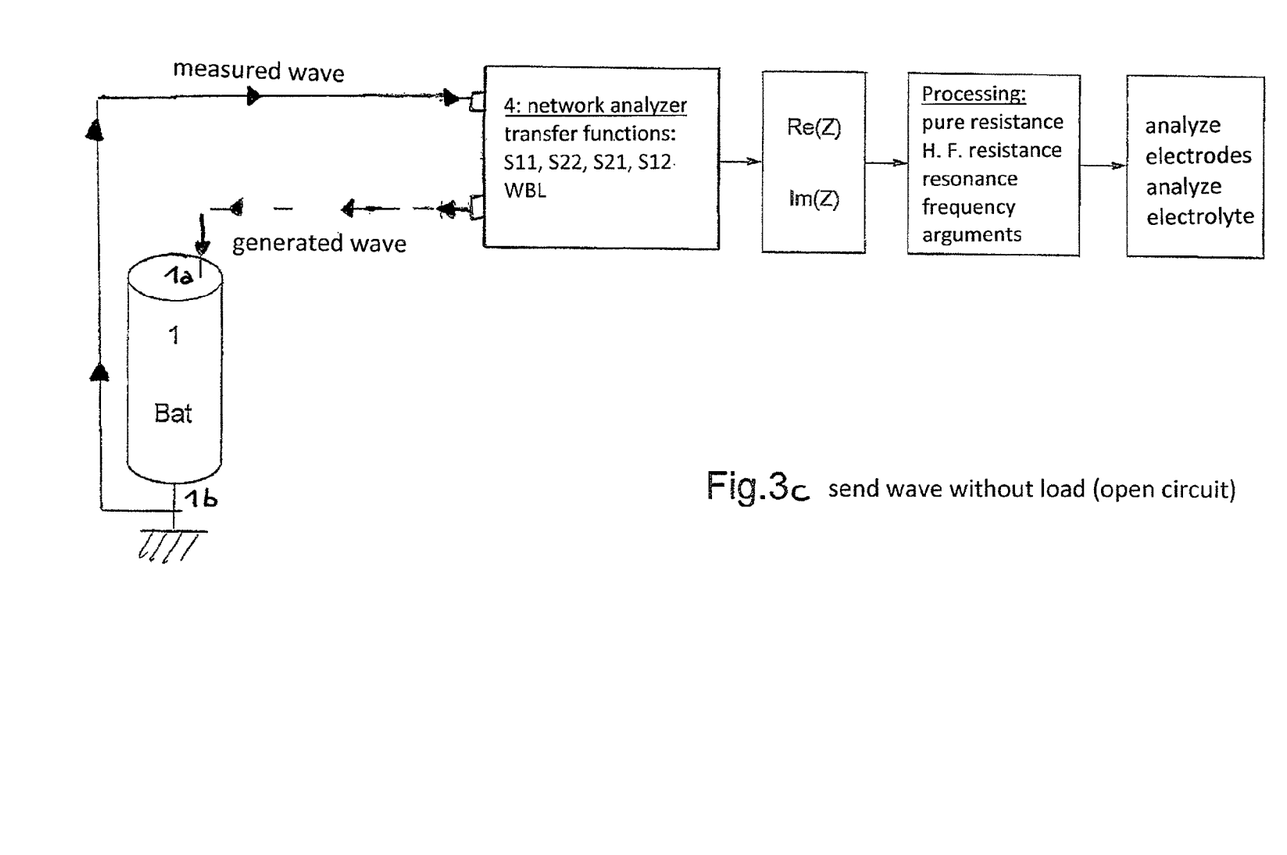
FIG. 3c is a schematic diagram of the acquisition of impedance measurements in the case where an electromagnetic wave is transmitted by the electrode plate group, the electrochemical cell being neither charged nor discharged (open circuit).
Figure 3D:
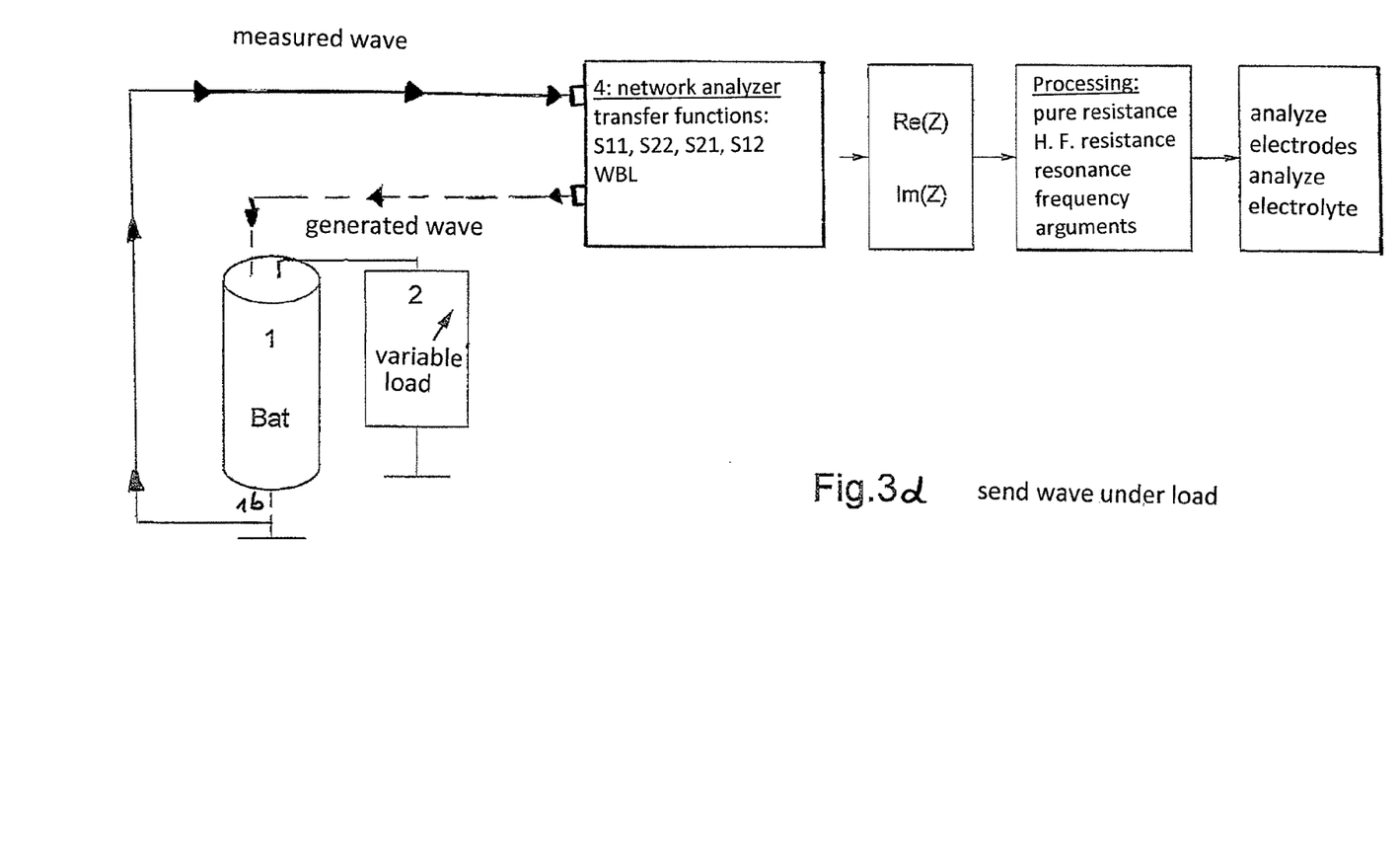
FIG. 3d is a schematic diagram of the acquisition of impedance measurements in the case where an electromagnetic wave is transmitted by the electrode plate group, the electrochemical cell being either charged or discharged.

A schematic diagram of apparatus for measuring the impedance is shown in FIGS. 3a-3d. The impedance measurement may be performed either in the case where the electromagnetic wave is reflected by the electrode plate group (FIG. 3a-3b) or in the case where the electromagnetic wave is transmitted by the electrode plate group (FIG. 3c-3d). Whether the electromagnetic wave is measured in reflection or in transmission, the electrochemical cell may either form an open circuit or it may undergo a charge or a discharge. The electromagnetic wave signal is of high frequency, characterization while delivering current is thus possible because the state of charge of the electrochemical cell does not change within less than 1 ms.

FIG. 3a is a schematic diagram of the acquisition of impedance measurements in the case where an electromagnetic wave is reflected by the electrode plate group and the electrochemical cell (1) is neither charged nor discharged (open circuit). An electromagnetic signal is generated by a network analyzer (4). The signal is sent through a means for conducting an electromagnetic wave to one terminal of the electrochemical cell. The network analyzer receives the signal constituted by the electromagnetic wave reflected by the electrode plate group. The real part and the imaginary part of the signal can be measured using the network analyzer, the internal impedance of which is conventionally 50 Ω. The network analyzer is used to calculate the complex impedances and transfer functions using S-parameters: S11 and S22 for reflection and S21 and S12 for transmission. It also makes it possible to determine the frequency band for the length of the electrode plate group in the unwound state (WBL) as well as the frequency band for the height of the electrode plate group (WBH). The use of the real part of impedance makes it possible to determine the pure resistance component of the impedance as well as high frequency resistance. These resistance values can detect premature aging of the cell or a failure. Using the imaginary part of the impedance makes it possible to determine resonance frequencies along with the arguments that are then used to detect aging of the electrolyte, the presence of micro short-circuits or poor filling of the electrolyte.

FIG. 3b is a schematic diagram of the acquisition of impedance measurements in the case where an electromagnetic wave is reflected by the electrode plate group and the electrochemical cell is either charged or discharged (reflection under load). The apparatus on FIG. 3b differs from that of FIG. 3a in that it comprises a load (2) delivering to the electrochemical cell (1) a signal which allows optionally charging or discharging the cell if one wishes to characterize the cell in operation (characterization while being charged or while delivering current).

FIG. 3c is a schematic diagram of the acquisition of impedance measurements in the case where an electromagnetic wave is transmitted by the electrode plate group and the electrochemical cell (1) is neither charged nor discharged (open circuit). The wave generated by the network analyzer is sent to one terminal (1a) of the electrochemical cell. The wave transmitted by the electrode plate group is sent by the terminal (1b) located on the opposite end of the electrochemical cell. The network analyzer (4) receives the signal constituted by the electromagnetic wave transmitted by the terminal (1b) located on the opposite end of the electrochemical cell.

FIG. 3d is a schematic diagram of the acquisition of impedance measurements in the case where an electromagnetic wave is transmitted by the electrode plate group and the electrochemical cell is either charged or discharged. The apparatus on FIG. 3d differs from that of FIG. 3c in that it comprises a load (2) delivering to the electrochemical cell (1) a signal which allows optionally charging or discharging the cell if one wishes to characterize the cell in operation (characterization while being charged or while delivering current).

This apparatus can be implemented at different points of control of a production line for the electrochemical cell in order to detect a defect. It can also be integrated into a pack containing a battery of electrochemical cells.

According to the invention, the complex impedance of the electrochemical cell is measured by subjecting the cell to an electromagnetic wave, the frequency of which falls in the range of from 10 kHz to 10 GHz. The impedances measured by this apparatus can be measured with an electrochemical cell in open circuit or optionally discharging into a circuit. Current can vary from a few milliamps to tens of amps. As explained above, since the electromagnetic wave signal is of high frequency, characterization while delivering current is possible because the state of charge of the electrochemical cell does not change within less than 1 ms.

Use of the resonance frequency $f_0$, which is the frequency at which the imaginary part of the complex impedance becomes zero, provides information on the size of the electrode plate group. Without wishing to be bound by theory, the assignee believes that the following approximations are significantly representative of the observed phenomena.

Figure 4:
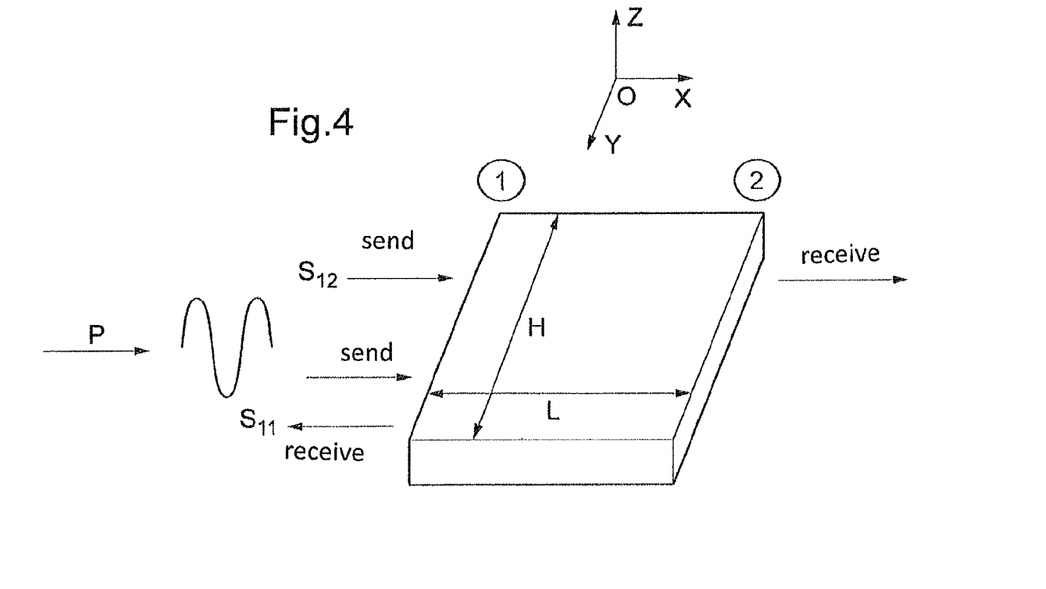
FIG. 4 shows the propagation of an electromagnetic wave in the direction P through a flat plate with a height H and length L.

Let us consider a flat plate of dimensions L, of height H, permittivity $\epsilon r$, relative permeability $\mu_r$, traversed in the direction of its length L by an electromagnetic wave in the direction P, as shown in FIG. 4. Propagation of the electromagnetic wave in the flat plate provides the following characteristic resonant frequencies in reflection (S11) and in transmission (S12):

$$f_0(L) = \frac{4c}{\sqrt{(\varepsilon_r \times \mu_r)} \times L} \text{ (Hz)}$$

$$f_0(H) = \frac{c}{2\sqrt{(\varepsilon_r \times \mu_r)} \times H} \text{ (Hz)}$$

where:
c is the speed of propagation of an electromagnetic wave in a vacuum, equal to $3 \times 10^8$ ms$^{-1}$;
$\epsilon_r$ is the average relative permittivity of the material in which the electromagnetic wave propagates;
$\mu_r$ is the average relative permeability of the medium in which the electromagnetic wave propagates and is 1.

S12 corresponds to the transfer function when the wave arrives at edge 1 of the plate and is received at the edge 2 of the plate.

S11 corresponds to the transfer function when the wave arrives at the edge 1 of the plate and is received at the same edge 1 of the plate.

The propagation of an electromagnetic wave depends on the propagation, or conduction, medium but also on regions of reflection which it may encounter. Reflection occurs along the z axis perpendicular to the direction of propagation P of the wave.

Figure 5A:
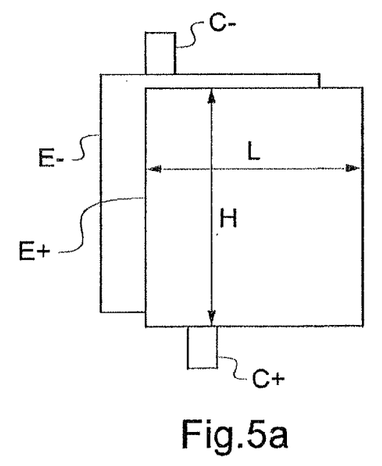
FIGS. 5a and 5b show a simplified cell of the "bag" or "pouch cell" type comprising a plane positive electrode (E+) and a negative electrode (E−), respectively having a positive current collector (C+) and a negative current collector (C−).
Figure 5B:
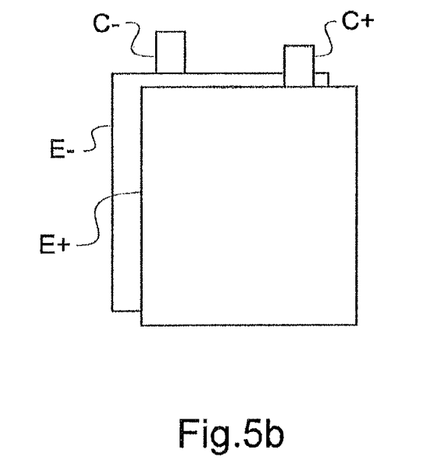

According to the invention, the electrode plate group is equated to a flat plate through which the wave propagates. A simplified electrode plate group can consist of two flat plates corresponding to a positive electrode and a negative electrode which are separated by an electrolyte-impregnated separator. Metal tabs constituting output current collectors are present on an edge of each plate. These tabs may be present either at opposite edges for both plates, or on the same edges for both plates. These two configurations are illustrated in FIGS. 5a and 5b. The assembly is inserted into a flexible heat-sealable pouch, not shown, serving as a container. Thus a cell of the pouch cell type is constituted. The stack of electrode plate groups leads to prismatic cells which can of course be analyzed by the present method.

Each pouch-type cell can be equated to a flat plate of length L and height H and relative permittivity $\epsilon r$. The value of $\epsilon r$ depends on the permittivities of the current collectors, the electrochemically active masses of electrodes, the electrolyte and the separator. Each change in one of these components can lead to a variation in $\epsilon_r$ and therefore overall to a variation in resonance frequency $f_0$.

Figure 5C:
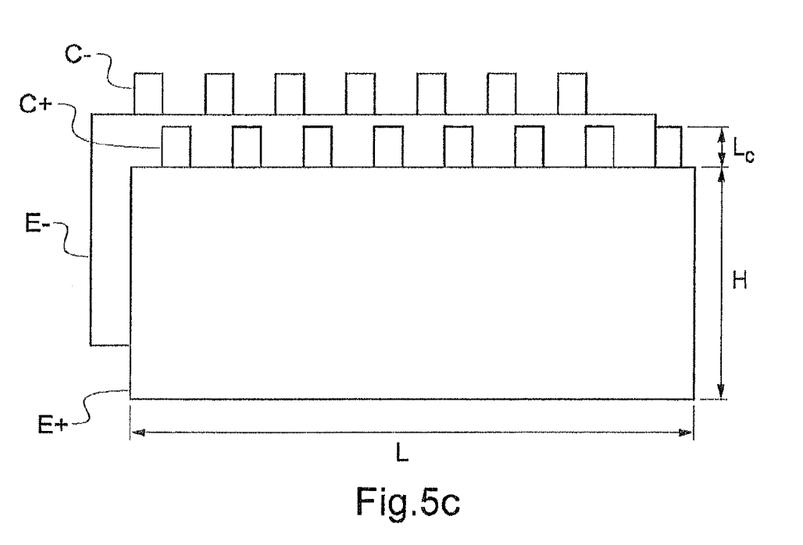
FIG. 5c shows an electrode plate group in the unwound state showing the electrodes making up the electrode plate group. The current collectors (C−, C+) are located on the same edge of the electrodes.

In the event that the tabs of the current collectors are disposed on the same edge of both electrodes, then there is a similarity between the structure of an unwound electrode plate group in which the current collectors are located on the same edge of both electrodes (FIG. 5c) and the structure of a pouch cell (FIG. 5b).

A modification of the electrochemical cell results in a change of relative permittivity $\epsilon r$ and/or the reflective properties of the medium traversed by the electromagnetic wave and thus a distortion of the signal. Although the different values of relative permittivity are known for the current collectors, the active materials and the electrolyte considered individually, the overall permittivity value of the electrode plate group cannot be determined by theoretical calculation since the stack constituted by the electrode plate group forms a discontinuous, porous and non-homogeneous assembly.

Response to an electromagnetic wave for different states of the cell can be quantified by experiment, or even for the future, by simulation. Parameter templates can for example be used to ascertain the state of the cell, whether in terms of homogeneity of filling, aging, state of charge or leakage current, for example. Some of these cases are detailed in the following.

By equating an electrode plate group to a flat plate, we obtain a relationship between resonance frequency $f_0$ (L) and length L of the metal strip of the electrodes (equation (I)):

$$f_0(L) \approx \frac{4c}{\sqrt{(\varepsilon_r \times \mu_r)} \times k \times (L + L_c)} \text{ (Hz)} \quad (I)$$

in which
c, $\epsilon_r$, $\mu_r$ are as defined above;
L is the length in meters of the metal strip of the electrodes, that is to say the length of the unwound electrode plate group;
$L_c$ is the length in meters of the metal foil portion not covered with active material. This portion not covered with active material is used for welding the positive and negative connections to the respective current output terminals. It is generally negligible, being much smaller than L;
k is a correction factor due to the spirality of the electrode plate group and is approximately 0.88.

Figure 6:
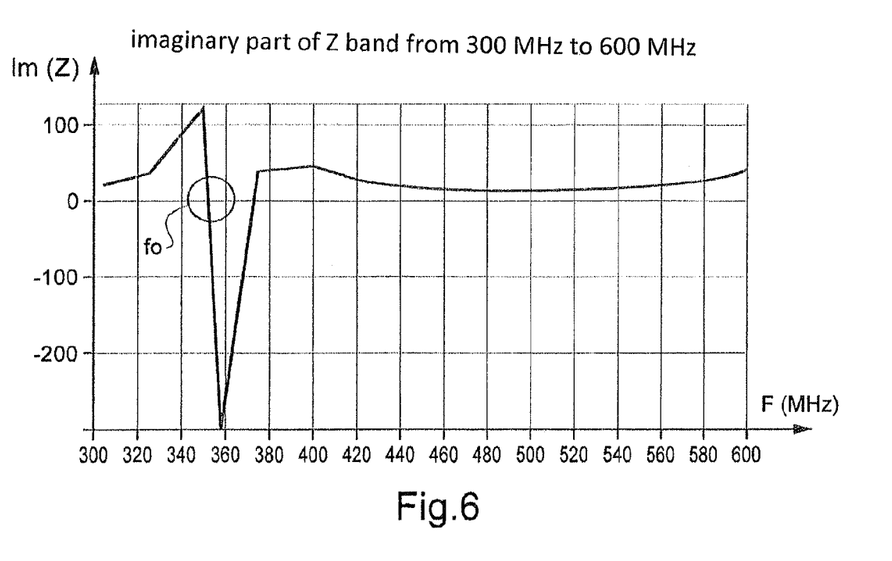
FIG. 6 shows an example of variation in the imaginary part of the complex impedance for a frequency between 300 and 600 MHz.

The relation between the resonance frequency and the height of the metal strip of the electrodes is (equation (II)):

$$f_0(H) \approx \frac{c}{2\sqrt{(\varepsilon_r \times \mu_r)} \times (H + L_c)} \text{ (Hz)} \quad (II)$$

in which:
c, $\epsilon_r$, $\mu_r$ are as defined above;
H is the width in meters of the metal strip of the electrodes, that is to say the height of the electrode plate group;
$L_c$ is as defined above;

FIG. 6 shows variation in the imaginary part of the complex impedance as a function of frequency for frequencies of the electromagnetic wave between 300 and 600 MHz for an electrochemical cell of the lithium-ion type. The curve for variation of the imaginary part as a function of frequency has a peak at a frequency of about 360 MHz. The circle shown in FIG. 6 shows that we can determine the frequency $f_0$ at which the imaginary part of the impedance is zero. This frequency is in FIG. 6 between 340 and 360 MHz. The deformation at the peak relative to the spectrum obtained on an electrochemical cell considered good or a change in frequency will be an indication of a change of state of the cell relative to a cell calibrated experimentally, or even with respect to a model.

The validity of the model established by the assignee is confirmed by the results of tests conducted on different cells of the lithium-ion type of cylindrical format, all including a graphite-based negative electrode, a positive electrode based on $LiNiO_2$ and an electrolyte which is a mixture of carbonated solvents in which $LiPF_6$ is dissolved. Their nominal voltage is 3.6 V. Different electrochemical capacities and different sizes of the electrode were tested. Table 1 shows the different electrochemical capacities and dimensions tested. Tables 1 and 2 show the resonance frequencies associated with each of the cells tested. The presence of two resonance frequencies $f_0$ for the width and length of the electrode plate group constitute a validation of the hypothesis that the electrode plate group can be considered as an electromagnetic wave propagation line. It was found that the resonance frequency $f_0$ for the length varies between 120 and 176 MHz (Table 1) and the resonance frequency $f_0$ for the height varies between 324 and 570 MHz (Table 2).

TABLE 1

|  | Ex. 1 | Ex. 2 | Ex. 3 | Ex. 4 | Ex. 5 |
| --- | --- | --- | --- | --- | --- |
| Electrochemical capacity of the cell (Ah) | 41 | 45 | 30 | 22 | 6 |
| Actual length of the strip (m) | 4.76 | 4 | 6 | 4.7 | 4.5 |
| Length $L_c$ of the connecting tab (m) | 0.03 | 0.03 | 0.03 | 0.03 | 0.03 |
| Resonance frequency $f_0$ for the length of the strip (MHz) | 152 | 176 | 120 | 152 | 159 |

The relationship (I) applied to the cell of Example 1 of Table 1 gives the following value for the length L of the electrode:

$$L = \left(\frac{4c}{f_0 \times \sqrt{\varepsilon_r} \times k} - L_c = \right)\left(\left(\frac{4 \times 300}{152 \times \sqrt{3.5} \times 0.88}\right) - 0.03 = \right.$$

$$\left. (4.795 - 0.030) \text{ m} = 4.765 \text{ m} \approx 4.77 \text{ m}\right)$$

The value for the length of 4.77 m obtained by calculation is almost equal to the actual height of 4.76 m as shown in Table 1.

TABLE 2

|  | Ex. 1 | Ex. 2 | Ex. 3 | Ex. 4 | Ex. 5 |
| --- | --- | --- | --- | --- | --- |
| Actual strip height H (m) | 0.222 | 0.222 | 0.222 | 0.106 | 0.106 |
| Length $L_c$ of the connecting tab (m) | 0.03 | 0.03 | 0.03 | 0.03 | 0.03 |
| Resonance frequency $f_0$ for the strip height (MHz) | 324 | 324 | 324 | 570 | 570 |

Equation (II) applied to the cell of Example 1 of Table 2 gives the value of the height H of the electrode plate group as follows:

$$H = \left(\left(\frac{c}{f_0 \times 2 \times \sqrt{\varepsilon_r}}\right) - L_c = \right)$$

$$\left(\left(\frac{300}{324 \times 2 \times \sqrt{3.5}}\right) - 0.03 = (0.247 - 0.03) \text{ m} = 0.217 \text{ m}\right)$$

The value of the height of 0.217 m obtained by calculation is practically identical to the actual height of 0.222 m shown in Table 2.

Relationships (I) and (II) express the resonance frequency $f_0$ with respect to relative permittivity $\varepsilon_r$. They show that a change in the value of the relative permittivity of the medium of propagation of the electromagnetic wave results in a variation in resonance frequency. The relative permittivity $\varepsilon_r$ varies, for example following a modification of the composition of the electrolyte, or a variation of the degree of impregnation of the electrodes or the development of micro short-circuits. Therefore, there is a variation of resonance frequency due to a change in the composition or in the uniformity of the electrolyte.

The method according to the invention can be used as monitoring means for detecting the presence of micro short-circuits or inadequate filling of the electrolyte on a manufacturing line of the electrochemical cell. In this case, as a first step measurement is performed of the complex impedance of a reference electrochemical cell having precisely known physical parameters, that is to say dimensions of the electrode strips, volume and composition of the electrolyte, state of the separator and the degree of impregnation of the separator and the electrodes with electrolyte. The plot of the spectrum of the imaginary part of complex impedance as a function of frequency has a reference resonance frequency $f_{0R}$. In a second step measurement of complex impedance of an electrochemical cell to be tested is performed and its resonance frequency $f_0$ is determined. The cell is considered as having a defect if the difference between $f_0$ and $f_{0R}$ exceeds a predetermined threshold. It will be understood that this principle does not only apply to resonance frequency but to any other indicator as defined above.

Figure 7:
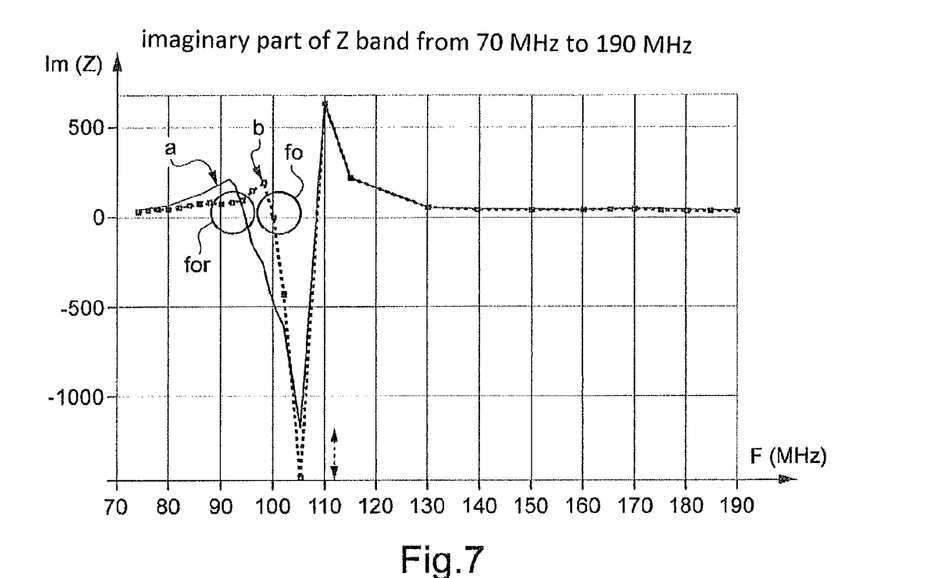
FIG. 7 shows an example of superposition of the plots of a) a first spectrum performed on a reference cell and b) a second spectrum performed on a cell under test.

FIG. 7 shows an example of superposition of the plots of a first reference spectrum obtained for a reference cell and a second spectrum obtained before a cell under test. The reference cell and the cell to be tested are both lithium-ion cells of cylindrical format and include a graphite-based negative electrode, a positive electrode based on $LiNiO_2$ and an electrolyte which is a mixture of carbonated solvents in which $LiPF_6$ is dissolved.

The reference cell a) is a cell on which impedance measurement was made immediately after the latter had been filled with electrolyte. The test cell b) had undergone a rest period of 8 days during which the degree of impregnation (or soaking) of the electrodes and the separator by the electrolyte changed. Indeed, electrolyte tends to diffuse into the pores of the separator and the pores of the active material. Relative permittivity of the medium through which the electromagnetic wave passes consequently varies due to change in the degree of impregnation of the electrodes and separator. Variation of the permittivity value causes a variation of the resonance frequency. Indeed for frequencies less than about 105 MHz, resonant frequencies differ. The resonance frequency $f_{0R}$ is approximately 95 MHz for the reference cell while the resonance frequency $f_0$ is about 100 MHz for the cell under test. The difference between the frequencies reflects a change of the electrolyte over time. The method according to the invention allows for example to determine the length of time required to obtain optimum impregnation of the electrodes and separator.

The plot of variation in the argument makes it possible to monitor changes in the electrochemical cell after it has undergone the first cycles of charge/discharge needed for it to reach its maximum capacity (also called "electrochemical cell formation"). Usually, we plot variation in the argument for a frequency ranging from 10 to 1000 MHz, preferably between 50 and 200 MHz.

Figure 8:
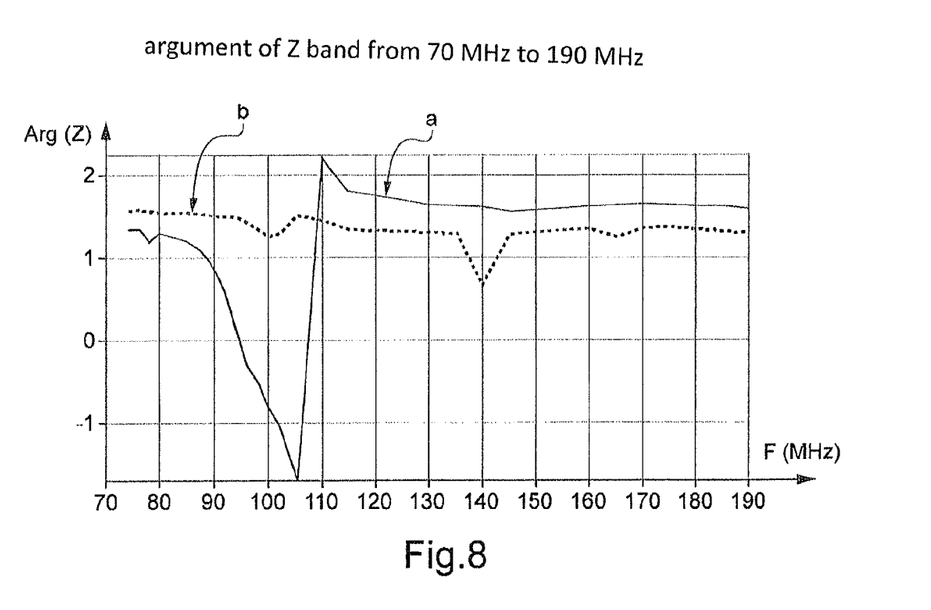
FIG. 8 shows an example of variation of the argument of the impedance of a) a cell after electrochemical formation and b) after a few days of rest, for a frequency range of 70-190 MHz.

For example, FIG. 8 shows the argument for a cell after electrochemical formation a) and its evolution b) after a few days for a frequency ranging from 70 to 190 MHz. It will be seen that immediately after formation, the argument has a peak at 105 MHz with an amplitude of about 2.5. This peak disappears after the electrochemical cell has been allowed to rest for a few days.

The plot of variation of the imaginary part and the real part as well as of the argument makes it possible to follow the aging of the electrode plate group or the degree of self-discharge. Usually, we plot variation of the argument for a frequency of 0.01 to 10 MHz, preferably between 0.1 and 1 MHz.

Figure 9:
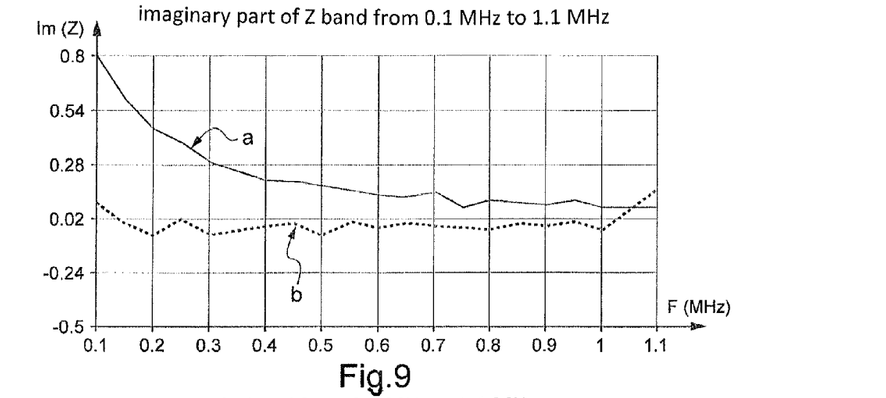
FIG. 9 shows an example of variation of the imaginary part of the impedance of two cells characterized by different self-discharge rates. The frequencies swept range from 0.1 to 1.1 MHz: for a) cell with negligible self-discharge rate, b) cell with a significant self-discharge rate.
Figure 10:
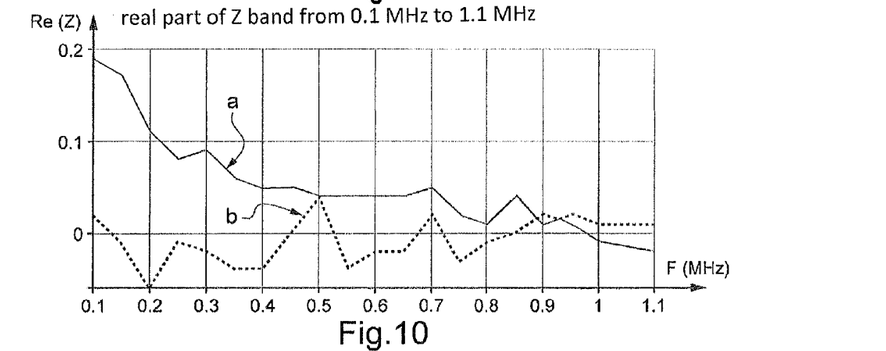
FIG. 10 shows an example of variation of the real part of the impedance of two cells characterized by different electrochemical self-discharge rates. The frequencies swept range from 0.1 to 1.1 MHz: for a) cell with negligible self-discharge rate, b) cell with a significant self-discharge rate.
Figure 11:
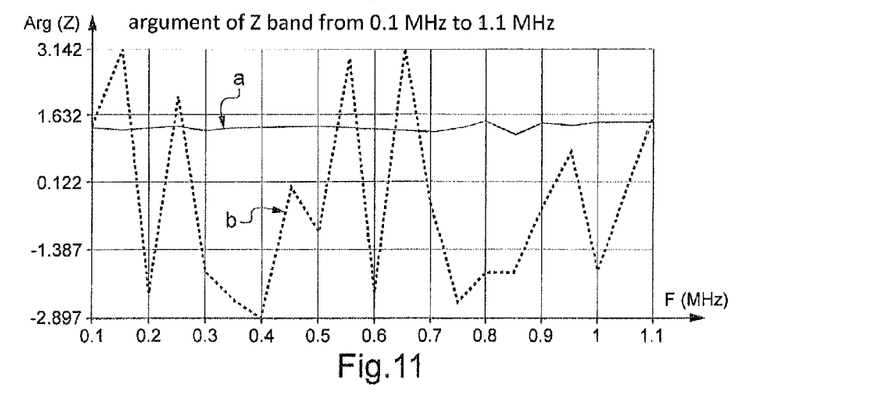
FIG. 11 shows an example of variation of the argument of two electrochemical cells characterized by different self-discharge rates. The frequencies swept range from 0.1 to 1.1 MHz: for a) cell with negligible self-discharge rate, b) cell with a significant self-discharge rate.

FIGS. 9, 10 and 11 represent respectively the imaginary part, the real part as well as the argument of impedance of two lithium-ion cells characterized by different self-discharge rates. For each of FIGS. 9-11, we see that the spectrum of the cell with the highest self-discharge rate b) shows abrupt variations on the y-axis. FIG. 11 shows variations in argument up to about 3-4 units for the cell having the highest self-discharge while the argument for the cell with the lowest self-discharge hardly varies and is about 1.5. Strong variations in the argument reflects a significant self-discharge of the electrochemical cell.

A criterion on peak height may be selected to be used to decide if the aging of the cell has reached a predetermined threshold. For example, if the spectrum shows a peak such that the difference between the value on the y-axis of the point at the peak and the maximum y-axis values of two points at the base at the peak divided by the value on the y-axis at the peak is greater than a certain predetermined value, then aging can be considered as significant.

An advantage of the method is that it allows determining the origin of an anomaly in an electrochemical cell. It makes it possible to monitor the state of an electrochemical cell leaving a production line and to determine how long it should be left to stand to obtain optimum impregnation of the separator and the electrodes with electrolyte. The method can detect possible differences in electrolyte thickness and filling defects. An additional advantage of the method is that the measurements are performed at high frequency, which reduces analysis time compared to impedance measurement performed in a lower frequency range. The method according to the invention may be a tool for quality control making it possible to monitor any drift in the cell manufacturing process. Impedance measurements were performed on two electrochemical cells sampled at the end of their manufacturing process. One of the cells is consistent with specifications and serves as a reference: this is example 1 of Tables 1 and 2. The other cell is not in accordance with specifications: it is Example 6.

TABLE 3

| | Resonance frequency for the length of the electrode plate group (MHz) | Resonance frequency for the height of the electrode plate group (MHz) |
| --- | --- | --- |
| Example 1: Cell consistent with specifications | 152 | 324 |
| Example 6: Cell not consistent with specifications | 145 | 403 |

The non-conforming cell of Example 6 exhibits resonant frequencies different from those of a cell consistent with specifications. The frequency variation is 5% for the resonance frequency for length and 25% for the resonance frequency for electrode plate group height. The method according to the invention can therefore be used to perform quality checks on electrochemical cells in a production line in order to monitor changes in the electrochemical cells produced.

The invention claimed is:

1. A processor-implemented method for determining a state variable of an electrochemical cell comprising an electrode plate group, said method comprising:
analyzing, by a processor, at least a portion of a response spectrum of the electrochemical cell to application of an electromagnetic wave in a frequency ranging from 10 kHz to 10 GHz, so as to determine an indicator of the value of said state variable;
determining, by the processor, an indicator of the value of said state variable;
monitoring, by the processor, the state variable of the electrochemical cell based on the determined indicator; and
determining, by the processor, that the electrochemical cell is defective if the response spectrum is outside a predetermined threshold.

2. The method according to claim 1, wherein the frequency ranges from 100 kHz to 10 GHz.

3. The method according to claim 1, wherein the value of the state variable is compared with a reference value and the electrochemical cell is considered to be defective if a difference between the value of the state variable and the reference value exceeds a predetermined threshold.

4. The method according to claim 1, wherein the value of the state variable is obtained by comparing a plot of variation of an indicator value of the state variable with a plot of the change of said indicator obtained from measurement of complex impedance of a reference cell.

5. The method according to claim 4, wherein the state variable is a parameter which varies during use of the electrochemical cell including at least one of its capacity, internal resistance, its state of charge, the state of aging of its electrodes, the state of aging of the electrolyte and the state of aging of the separator.

6. The method according to claim 1, comprising the steps of:
   measuring, by the processor, complex impedance of the electrode plate group;
   plotting, by the processor a complex impedance spectrum of the electrode plate group, and
   determining, by a processor, at least one resonance frequency $f_0$ of the complex impedance spectrum which is a frequency at which the imaginary part of the complex impedance is zero.

7. The method according to claim 6, wherein the complex impedance spectrum of the electrode plate group is plotted for a range of frequencies between 200 MHz and 1 GHz, and wherein within said range at least one resonance frequency $f_0$ exists, in order to determine the state variable corresponding to the height of the electrode plate group.

8. The method according to claim 6, wherein the complex impedance spectrum of the electrode plate group is plotted for a range of frequencies between 10 MHz and 200 MHz, and wherein within the said range at least one resonance frequency $f_0$ exists, in order to determine the state variable corresponding to the length of the unwound electrode plate group.

9. The method according to claim 1, comprising the steps of:
   measuring, by the processor, complex impedance of the electrode plate group;
   plotting, by the processor, a variation from a frequency ranging from 0.01 MHz to 10 MHz, of at least one indicator selected from the real part of the complex impedance, the imaginary part of the complex impedance or a combination of these so as to determine a state variable.

10. The method according to claim 9, including comparing, by the processor, a plot of variation in at least one of said indicators to a plot of variation in the same indicator or indicators obtained from measurement of complex impedance of a reference electrode plate group.

11. The method according to claim 10, wherein the indicator is the imaginary part of the complex impedance and a variation plot of the indicator as a function of frequency has at least one peak, such that a ratio:
   (Immax−Max (Im1, Im2))/Immax is greater than 0.5
   where
   Immax denotes the imaginary part of the complex impedance at the peak;
   Im1 and Im2 denote the imaginary parts of two points at a base of the peak, and
   Max (Im1, Im2) represent a maximum value of Im1 and Im2.

12. The method of claim 11, wherein Immax is greater than 0.75.

13. The method according to claim 9, wherein variation in the real part of the complex impedance as a function of frequency is represented and at least one peak exists such that a ratio:
   (Remax−Max (Re1, Re2))/Remax is greater than 0.5
   wherein
   the Remax denotes the real part at the peak;
   Re1 and Re2 denote the real parts of two points at a base of the peak, and
   Max (Re1, Re2) denotes the maximum value of Re1 and Re2.

14. The method according to claim 9, wherein the combination of the real part of the complex impedance and the imaginary part of the complex impedance is an argument of the complex impedance.

15. The method according to claim 1, wherein the electrochemical cell is a lithium cell.

16. The method according to claim 1, wherein the frequency ranges from 1 MHz to 1 GHz.

17. The method according to claim 1, wherein the frequency ranges from 10 MHz to 1 GHz.

18. A processor-implemented method of monitoring the manufacture of electrochemical cells for determining a state variable of an electrochemical cell comprising an electrode plate group, the method comprising:
   analyzing, by a processor, at least a portion of a response spectrum of the electrochemical cell to application of an electromagnetic wave in a frequency ranging from 10 kHz to 10 GHz, so as to determine an indicator of the value of said state variable, wherein:
   the value of the state variable is measured on each cell manufactured;
   a cell is rejected if the difference between the value of the state variable measured and a reference value exceeds a predetermined threshold.

19. The monitoring method according to claim 18, comprising statistical sampling, by the processor, of electrochemical cells on a production line in order to monitor changes in the cells produced.

20. A non-transitory computer readable medium storing instruction, which when executed by a computer causes the computer to implement a method of determining a state variable of an electrochemical cell comprising an electrode plate group, the method comprising:
   analyzing, by a processor, at least a portion of a response spectrum of the electrochemical cell to application of an electromagnetic wave in a frequency ranging from 10 kHz to 10 GHz, so as to determine an indicator of the value of said state variable.

* * * * *